(12) United States Patent
Kim

(10) Patent No.: US 10,720,599 B2
(45) Date of Patent: Jul. 21, 2020

(54) ORGANIC LIGHT-EMITTING DISPLAY DEVICE HAVING A PARTITION WALL

(71) Applicant: LG Display Co., Ltd., Seoul (KR)

(72) Inventor: Kyung-Man Kim, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 24 days.

(21) Appl. No.: 15/690,545

(22) Filed: Aug. 30, 2017

(65) Prior Publication Data

US 2018/0062109 A1    Mar. 1, 2018

(30) Foreign Application Priority Data

Aug. 31, 2016    (KR) .................. 10-2016-0112196

(51) Int. Cl.
*H01L 51/52* (2006.01)
*H01L 27/32* (2006.01)

(52) U.S. Cl.
CPC ...... *H01L 51/5237* (2013.01); *H01L 27/3246* (2013.01); *H01L 51/5209* (2013.01); *H01L 51/5212* (2013.01); *H01L 51/5228* (2013.01)

(58) Field of Classification Search
None
See application file for complete search history.

(56) References Cited

U.S. PATENT DOCUMENTS

| | | | |
|---|---|---|---|
| 2007/0064486 A1 | 3/2007 | Sung et al. | |
| 2012/0161167 A1* | 6/2012 | Yamazaki | H01L 27/3204 257/88 |
| 2015/0001507 A1* | 1/2015 | Kim | H01L 27/3246 257/40 |
| 2015/0060809 A1 | 3/2015 | Kim et al. | |
| 2015/0179718 A1* | 6/2015 | Kim | H01L 27/3246 257/40 |
| 2016/0190508 A1* | 6/2016 | Nakamura | H01L 27/322 257/40 |
| 2017/0033166 A1 | 2/2017 | Shim et al. | |

(Continued)

FOREIGN PATENT DOCUMENTS

| | | |
|---|---|---|
| CN | 103137891 A | 6/2013 |
| CN | 106206646 A | 12/2016 |
| CN | 106409870 A | 2/2017 |

(Continued)

OTHER PUBLICATIONS

Communication dated Feb. 1, 2018 from the European Patent Office in counterpart EP application No. 17188644.3.

(Continued)

*Primary Examiner* — Walter H Swanson
*Assistant Examiner* — Kien C Ly
(74) *Attorney, Agent, or Firm* — Morgan, Lewis & Bockius LLP

(57) ABSTRACT

An organic light-emitting display device including a partition wall is provided. The organic light-emitting display device includes a first bank insulating layer covering an edge of a lower electro and a second bank insulating layer supporting the partition wall. The second bank insulating layer is completely spaced apart from the first bank insulating layer. The first bank insulating layer facing the second bank insulating layer is completely covered by an upper electrode which is disposed on a portion of the lower electrode exposed by the first bank insulating layer.

14 Claims, 5 Drawing Sheets

(56) References Cited

U.S. PATENT DOCUMENTS

2017/0125506 A1* 5/2017 Kim .................. H01L 51/5212
2018/0212007 A1 7/2018 Lee et al.

FOREIGN PATENT DOCUMENTS

| EP | 2 827 371 A1 | 1/2015 |
| EP | 3 098 853 A1 | 11/2016 |
| EP | 3 125 294 A1 | 2/2017 |
| KR | 10-2016-0079523 A | 7/2016 |

OTHER PUBLICATIONS

First Notification of Office Action dated Feb. 11, 2019 from China National Intellectual Property Administration in counterpart Chinese application No. 201710711143.7. Note: EP 2 827 371, US 2015/0060809, US 2007/0064486, KR 10-2016-0079523, US 2015/0179718, CN 103137891, and US 2016/0190508.

* cited by examiner

ORGANIC LIGHT-EMITTING DISPLAY DEVICE HAVING A PARTITION WALL

This application claims the priority benefit of Korean Patent Application No. 10-2016-0112196, filed on Aug. 31, 2016, which is hereby incorporated by reference as if fully set forth herein.

BACKGROUND

Technical Field

The present invention relates to an organic light-emitting display device, and more particularly, to an organic light-emitting display device connecting an auxiliary electrode to an upper electrode using a partition wall.

Discussion of the Related Art

Generally, electronic appliances, such as a monitor, a TV, a laptop computer, and a digital camera, include a display device to realize an image. For example, the display device may include a liquid crystal display device and an organic light-emitting display device.

The organic light-emitting display device may include light-emitting structure. For example, the light-emitting structure may include a lower electrode, a light-emitting layer and an upper electrode, which are sequentially stacked. In the organic light-emitting display device, an auxiliary electrode is used in order to prevent voltage drop and transport power supplying through the upper electrode.

The organic light-emitting display device may prevent the deposition of the organic light-emitting layer on an upper surface of the auxiliary electrode using a partition wall, in order to prevent that the auxiliary electrode does not enough contact with the upper electrode by the organic light-emitting layer between the lower electrode and the upper electrode.

However, since the upper electrode and/or a protective layer formed on the upper electrode may be not deposited on an insulating layer, such as a bank insulating layer supporting the partition wall by the partition wall, the path of permeating the external moisture to the organic light-emitting layer may be provided.

SUMMARY

Accordingly, the present disclosure is directed to an organic light-emitting display device having a partition wall that substantially obviates one or more problems due to limitations and disadvantages of the related art.

An object of the present invention is to provide an organic light-emitting display device which may prevent that the moisture is permeated through the insulating layer supporting the partition wall.

Another object of the present invention is to provide an organic light-emitting display device which may enough ensure a contact area between an upper electrode and an auxiliary electrode using a partition wall, and may prevent that a degradation of an organic light-emitting layer by the moisture permeated from the outside.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these objects and other advantages and in accordance with the purpose of the invention, as embodied and broadly described herein, an organic light-emitting display device comprises an auxiliary electrode disposed side by side with a lower electrode. A first bank insulating layer is disposed on the lower electrode and the auxiliary electrode. The first bank insulating layer includes a first hole exposing an upper surface of the lower electrode and a second hole partially exposing an upper surface of the auxiliary electrode. A second bank insulating layer is disposed at the inside of the second hole. The second bank insulating layer is spaced apart from the first bank insulating layer. A partition wall overlaps the second bank insulating layer.

Side surfaces of the first bank insulating layer facing the second bank insulating layer may be positively tapered.

An organic light-emitting layer and an upper electrode may be sequentially stacked on a portion the lower electrode exposed by the first hole. The upper electrode may extend onto the side surfaces of the first bank insulating layer facing the second bank insulating layer.

The side surfaces of the first bank insulating layer facing the second bank insulating layer may be completely covered by the upper electrode.

A protective layer may be disposed on the upper electrode. The protective layer may extend along the upper electrode.

The auxiliary electrode may include a same material as the lower electrode. The second bank insulating layer may include a same material as the first bank insulating layer.

The maximum horizontal area of the partition wall may be larger than a horizontal area of the second bank insulating layer. The maximum horizontal area of the partition wall may be smaller than a horizontal area of the first hole.

The outermost side surface of the partition wall may be disposed between the first bank insulating layer and the second bank insulating layer.

The second bank insulating layer may extend in a direction perpendicular to the direction in which the auxiliary electrode extends at the inside of the second hole.

A length of the second bank insulating layer in a width-wise direction of the auxiliary electrode may be larger than the width of the auxiliary electrode.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated and constitute a part of this application, illustrate embodiments of the disclosure and together with the description serve to explain various principles. In the drawings.

DETAILED DESCRIPTION

Figure 1:
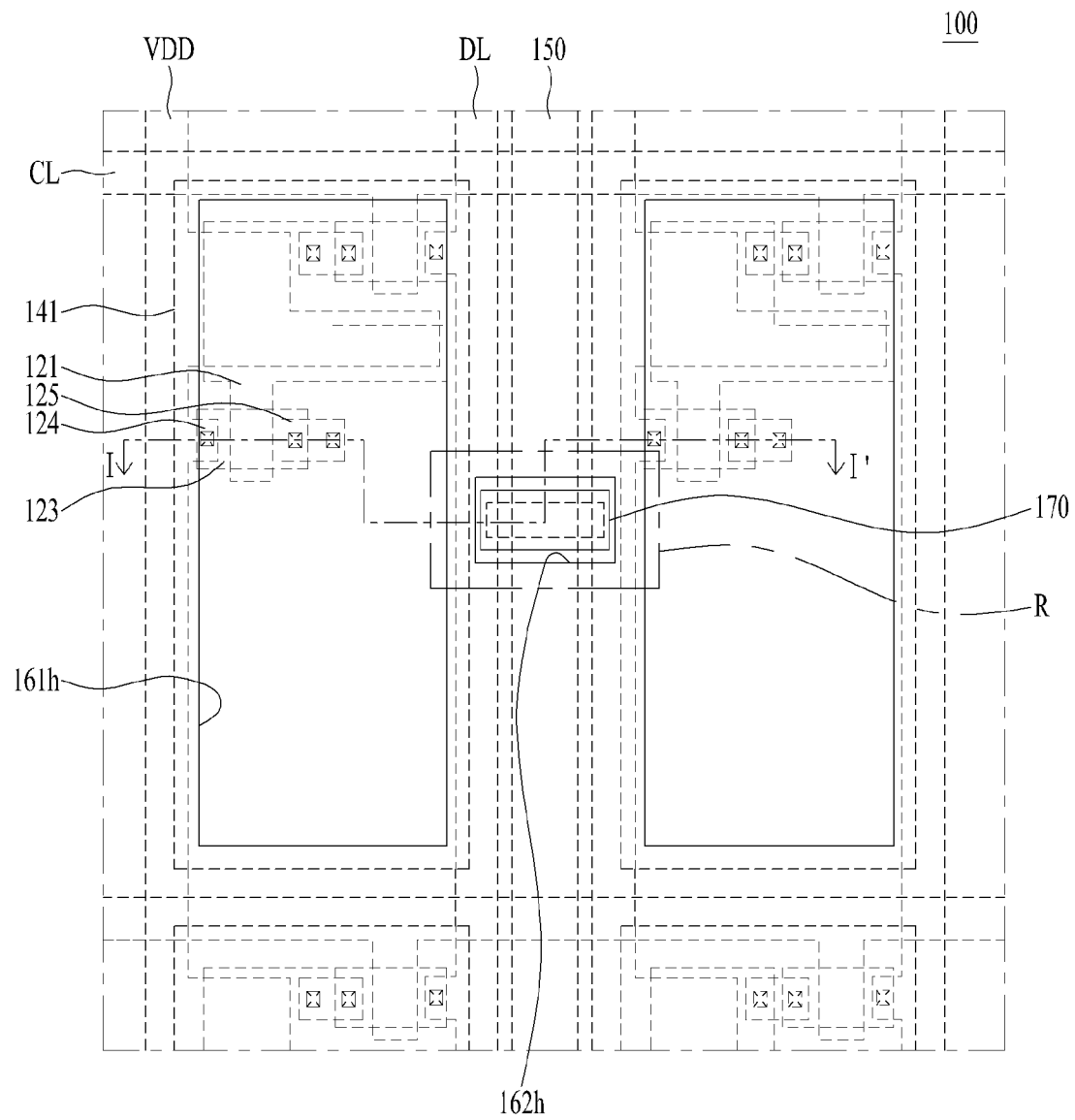
FIG. 1 is a top view schematically showing an organic light-emitting display device according to an embodiment of the present invention.

Hereinafter, details related to the above objects, technical configurations, and operational effects of the embodiments of the present invention will be clearly understood by the following detailed description with reference to the drawings, which illustrate some embodiments of the present invention. Here, the embodiments of the present invention are provided in order to allow the technical sprit of the present invention to be satisfactorily transferred to those skilled in the art, and thus the present invention may be embodied in other forms and is not limited to the embodiments described below.

In addition, the same or extremely similar elements may be designated by the same reference numerals throughout the specification, and in the drawings, the lengths and thickness of layers and regions may be exaggerated for convenience. It will be understood that, when a first element is referred to as being "on" a second element, although the first element may be disposed on the second element so as to come into contact with the second element, a third element may be interposed between the first element and the second element.

Here, terms such as, for example, "first" and "second" may be used to distinguish any one element with another element. However, the first element and the second element may be arbitrary named according to the convenience of those skilled in the art without departing the technical sprit of the present invention.

The terms used in the specification of the present invention are merely used in order to describe particular embodiments, and are not intended to limit the scope of the present invention. For example, an element described in the singular form is intended to include a plurality of elements unless the context clearly indicates otherwise. In addition, in the specification of the present invention, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Embodiment

Figure 2:
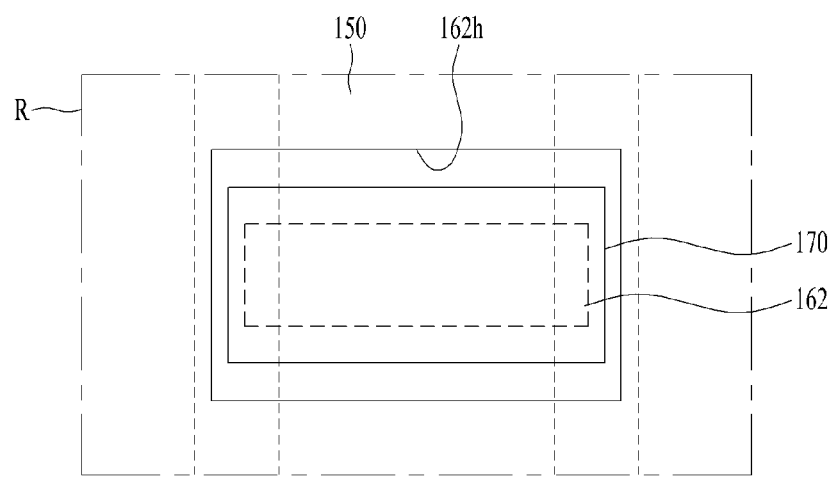
FIG. 2 is an enlarge view of region R in FIG. 1.
Figure 3:
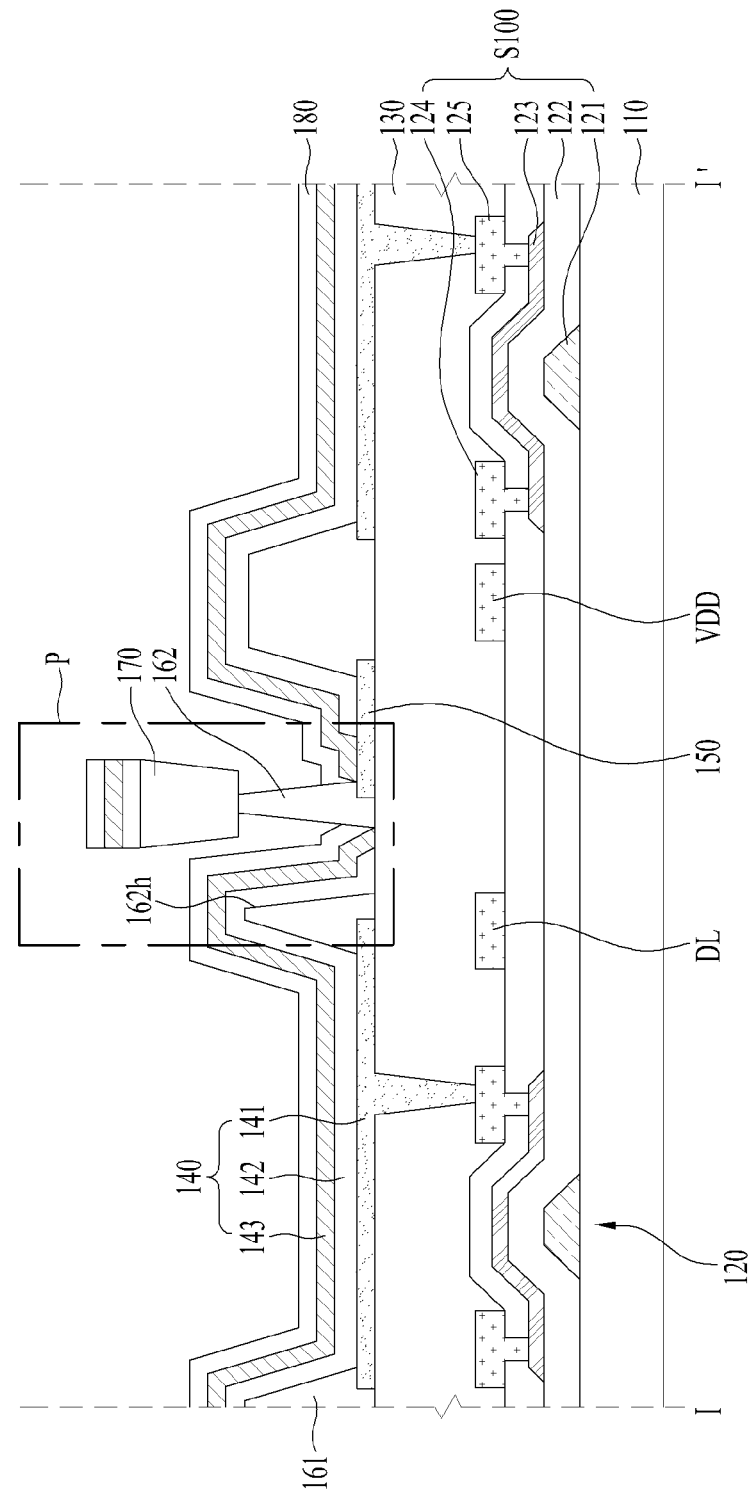
FIG. 3 is a cross-section view taken along line I-I' of FIG. 2.
Figure 4:
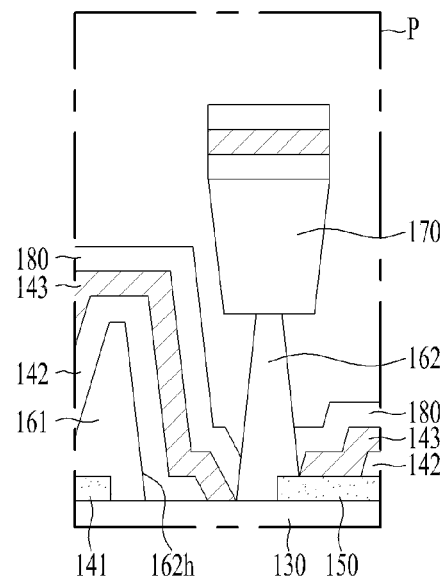
FIG. 4 is an enlarge view of region P in FIG. 3.

FIG. 1 is a top view schematically showing a display device according to an embodiment of the present invention. FIG. 2 is an enlarge view of region R in FIG. 1. FIG. 3 is a cross-section view taken along line I-I' of FIG. 2. FIG. 4 is an enlarge view of region P in FIG. 3.

Referring to FIGS. 1 to 4, the organic light-emitting display device according to the embodiment of the present invention may comprise a lower substrate 110, a thin film transistor 120, a planarization layer 130, a light-emitting structure 140, an auxiliary electrode 150, a first bank insulating layer 161, a second bank insulating layer 162 and a partition wall 170.

The lower substrate 110 may support the thin film transistor 120 and the light-emitting structure 140. The lower substrate 110 may include an insulating material. The lower substrate 110 may include a transparent material. For example, the lower substrate 110 may include a glass or a plastic.

A data line DL and a gate line GL intersecting the data line DL may be disposed on the lower substrate 110. The thin film transistor 120 may be disposed on a region intersecting the data line DL and the gate line GL. The thin film transistor 120 may include a gate electrode 121 disposed close to the lower substrate 110, a gate insulating layer 122 on the gate electrode 121, a semiconductor pattern 123 on the gate insulating layer 122, a source electrode 124 connected to a portion of the semiconductor pattern 123 and a drain electrode 125 connected to an opposite portion of the semiconductor pattern 123. The thin film transistor 120 may further include an interlayer insulating layer between the semiconductor pattern 123 and the source/drain electrodes 124 and 125.

The gate electrode 121, the source electrode 124 and the drain electrode 125 may include a conductive material. For example, the gate electrode 121, the source electrode 124 and the drain electrode 125 may include a metal. The drain electrode 125 may include a same material as the source electrode 124. The gate electrode 121 may include a material different from the source/drain electrodes 124 and 125.

The gate electrode 121 may be formed with a same material as the gate line GL. The data line DL may be formed with a same material as the source/drain electrodes 124 and 125. For example, a first power supply line VDD selectively connected to the lower electrode 141 of the light-emitting structure 140 by the thin film transistor 120 may be disposed side by side with the data line DL. The first power supply line VDD may include a same material as the source/drain electrodes 124 and 125.

The gate insulating layer 122 and the interlayer insulating layer may include an insulating material. The interlayer insulating layer may include contact holes connecting the source/drain electrodes 124 and 125 to the corresponding portion of the semiconductor pattern 123, respectively.

The organic light-emitting display device according to the embodiment of the present invention is described that the thin film transistor 120 is in direct contact with the lower substrate 110. However, the organic light-emitting display device according to another embodiment of the present invention may further comprise a buffer layer between the lower substrate 110 and the thin film transistor 120. The buffer layer may include an insulating material. For example, the buffer layer may be silicon oxide.

The organic light-emitting display device according to the embodiment of the present invention is described that the thin film transistor 120 includes a semiconductor pattern 123 above the gate electrode 121. However, the organic light-emitting display device according to another embodiment of the present invention may include a thin film transistor 120 which a gate electrode 121 is disposed above a semiconductor pattern 123.

The planarization layer 130 may be disposed on the thin film transistor 120. The planarization layer 130 may remove a thickness difference by the thin film transistor 120. The thin film transistor 120 may be completely covered by the planarization layer 130. For example, an upper surface of the planarization layer 130 may be parallel with a surface of the lower substrate 110. The planarization layer 130 may extend to the outside of the thin film transistor 120.

The planarization layer 130 may include an insulating material. For example, the planarization layer 130 may be silicon oxide.

The light-emitting structure 140 may generate light realizing a specific color. For example, the light-emitting structure 140 may include a lower electrode 141, an organic light-emitting layer 142 and an upper electrode 143, which are sequentially stacked.

The light-emitting structure 140 may selectively generate light by the thin film transistor 120. For example, the lower electrode 141 may be electrically connected to the drain electrode 125 of the thin film transistor 120. The light-emitting structure 140 may be disposed on the planarization layer 130. The planarization layer 130 may include a contact hole exposing the drain electrode 125 of the thin film transistor 120.

The lower electrode 141 and the upper electrode 143 may include a conductive material. The upper electrode 143 may include a material different from the lower electrode 141. For example, the lower electrode 141 may include a high-reflective material, and the upper electrode 143 may include a transparent material. For example, the lower electrode 141 may include a metal, and the upper electrode 143 may include ITO or IZO.

The organic light-emitting display device according to the embodiment of the present invention is described that the lower electrode 141 of the light-emitting structure 140 includes an opaque material. However, in the organic light-emitting display device according to another embodiment of the present invention, the lower electrode 141 may include a transparent material. For example, the organic light-emitting display device according to another embodiment of the present invention may be bottom emission type.

The organic light-emitting layer 142 may generate light, the brightness of which corresponds to the voltage difference between the lower electrode 141 and the upper electrode 143. The light generated by the organic light-emitting layer 142 may realize a specific color. For example, the light generated by the organic light-emitting layer 142 may realize white, blue, green or red.

The organic light-emitting layer 142 may include an emitting material layer (EML) having an organic emitting material. The organic light-emitting layer 142 may be a multi-layer structure, in order to increase luminous efficacy. For example, the organic light-emitting layer 142 may further include a hole injection layer (HIL), a hole transporting layer (HTL), an electron transporting layer (ETL), and an electron injection layer (EIL).

The auxiliary electrode 150 may supply a second power to the upper electrode 143 of the light-emitting structure 140. The auxiliary electrode 150 may be connected to a second power supply line VSS. For example, the auxiliary electrode 150 may be a portion of the second power supply line VSS.

The auxiliary electrode 150 may be disposed on the planarization layer 130. The auxiliary electrode 150 may be disposed between the lower electrodes 141 of the adjacent light-emitting structures 140. For example, the auxiliary electrode 150 may be disposed side by side with the lower electrode 141.

The auxiliary electrode 150 may include a conductive material. The auxiliary electrode 150 may include a same material as the lower electrode 141 of the light-emitting structure 140. For example, the auxiliary electrode 150 may include a metal.

The first bank insulating layer 161 may cover an edge of the lower electrode 141 of the light-emitting structure 140. The first bank insulating layer 161 may include a first hole 161h partially exposing an upper surface of the lower electrode 141. The organic light-emitting layer 142 and the upper electrode 143 may be sacked on a portion of an upper surface of the lower electrode 141 which is exposed by the first bank insulating layer 161. The organic light-emitting layer 142 and the upper electrode 143 may extend onto the first bank insulating layer 161.

The first bank insulating layer 161 may include an insulating material. For example, the first bank insulating layer 161 may include an organic material, such as benzocyclobutene (BCB), poly-imide and photo-acryl.

The first bank insulating layer 161 may be disposed on the auxiliary electrode 150. The first bank insulating layer 161 may include a second hole 162h partially exposing an upper surface of the auxiliary electrode 150. For example, the second hole 162h may be disposed between the adjacent lower electrodes 141.

The second bank insulating layer 162 may be disposed at the inside of the second hole 162h of the first bank insulating layer 161. A horizontal area of the second bank insulating layer 162 may be smaller than a horizontal area of the second hole 162h of the first bank insulating layer 161. The second bank insulating layer 162 may be spaced apart from the first bank insulating layer 161. All side surfaces of the second bank insulating layer 162 may be not in contact with the first bank insulating layer 161. For example, the second bank insulating layer 162 may be isolated at the inside of the second hole 162h of the first bank insulating layer 161.

All side surfaces of the second bank insulating layer 162 may be positively tapered. The side surfaces of the first bank insulating layer 161 facing the second bank insulating layer 162 may be positively tapered. The horizontal area of the second hole 162h may be increased away from the auxiliary electrode 150.

The organic light-emitting layer 142 and the upper electrode 143 may extend onto the side surfaces of the first bank insulating layer 161 facing the second bank insulating layer 162. The upper electrode 143 may be connected to the auxiliary electrode 150 through the second hole 162h. For example, the side surfaces of the first bank insulating layer 161 facing the second bank insulating layer 162 may be completely covered by the upper electrode 143.

The second bank insulating layer 162 may be a bar shape extending in a direction within the second hole 162h. The second hole 162h may extend in a direction perpendicular to the direction in which the auxiliary electrode 150 extends. A length of the second hole 162h in a widthwise direction of the auxiliary electrode 150 may be larger than the width of the auxiliary electrode 150. The second bank insulating layer may be a bar shape intersecting the auxiliary electrode 150.

The second bank insulating layer 162 may be disposed on a same layer as the first bank insulating layer 161. The second bank insulating layer 162 may include an insulating material. The second bank insulating layer 162 may include a same material as the first bank insulating layer 161. For example, the second bank insulating layer 162 may include an organic material, such as benzocyclobutene (BCB), poly-imide and photo-acryl.

The partition wall 170 may be disposed on the second bank insulating layer 162. The partition wall 170 may partially cut off the organic light-emitting layer 142 such that a contact area between the upper electrode 143 and the auxiliary electrode 150 may be sufficiently ensured. For example, a side surface of the partition wall 170 may be negatively tapered. The organic light-emitting layer 142 may be not formed and/or deposited under the negatively tapered side surface of the partition wall 170. The upper electrode 143 may be connected to the auxiliary electrode 150 under the negatively tapered side surface of the partition wall 170. The upper electrode 143 may be not deposited and/or formed on at least a part of the side surface of the second bank insulating layer 162 by the partition wall 170.

The maximum horizontal area of the partition wall 170 may be larger than the horizontal area of the second bank insulating layer 162. For example, the second bank insulating layer 162 may completely overlap the partition wall 170. The maximum horizontal area of the partition wall 170 may be smaller than the horizontal area of the second hole 162h. For example, the outermost side surface of the partition wall 170 may be disposed between the first bank insulating layer 161 and the second bank insulating layer 162. The partition wall 170 may include an insulating material.

In the organic light-emitting display device according to the embodiment of the present invention, the second bank insulating layer 162 supporting the partition wall 170 may be completely isolated from the first bank insulating layer 161 covering an edge of the lower electrode 141 of the light-emitting structure 140. Thus, in the organic light-emitting display device according to the embodiment of the present invention, the moisture permeated through the side surface of the second bank insulating layer 162 which is exposed to the outside by the partition wall 170 may be not move to the light-emitting structure 140. Therefore, in the organic light-emitting display device according to the embodiment of the present invention, the degradation of the organic light-emitting layer 142 by the permeated moisture may be prevented.

Also, in the organic light-emitting display device according to the embodiment of the present invention, all side surfaces of the first bank insulating layer 161 facing the second bank insulating layer 162 may be positively tapered. Thus, in the organic light-emitting display device according to the embodiment of the present invention, all side surfaces of the first bank insulating layer 161 facing the second bank insulating layer 162 may be covered by the upper electrode 143. Therefore, in the organic light-emitting display device according to the embodiment of the present invention, the degradation of the organic light-emitting layer 142 by the permeated moisture may be further prevented.

The organic light-emitting display device according to the embodiment of the present invention may further comprise a protective layer 180 in order to prevent the damage of the upper electrode 143. The protective layer 180 may include an inorganic material and/or an organic material in order to delay and/or prevent the permeation of the moisture. For example, the protective layer 180 may be a structure in which the inorganic material and the organic material are stacked.

The protective layer 180 may extend along the upper electrode 143. For example, the protective layer 180 may extend onto the side surfaces of the first bank insulating layer 161 facing the second bank insulating layer 162. Thus, in the organic light-emitting display device according to the embodiment of the present invention, the side surfaces of the first bank insulating layer 161 facing the second bank insulating layer 162 may be completely covered by the upper electrode 143 and the protective layer 180. Therefore, in the organic light-emitting display device according to the embodiment of the present invention, the degradation of the organic light-emitting layer 142 by the permeation of the moisture may be efficiently prevented.

Figure 5:
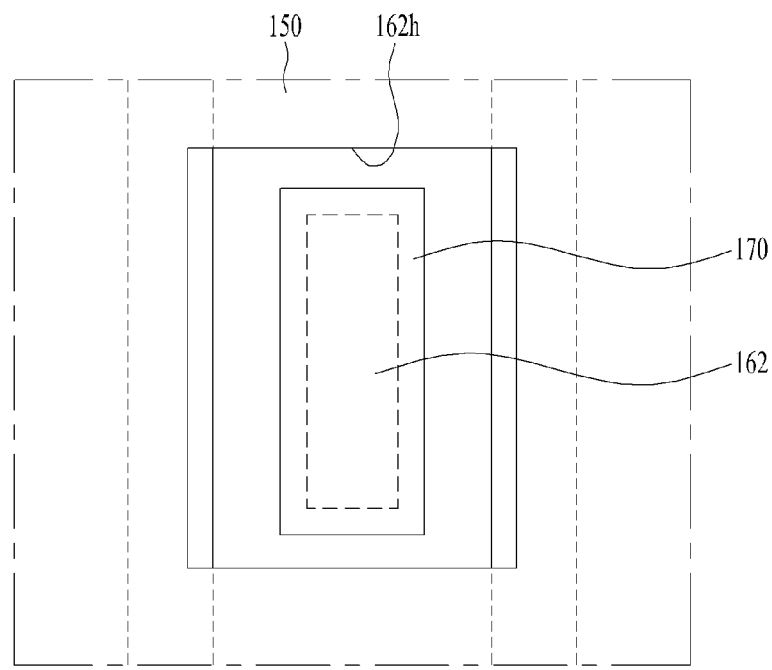
FIGS. 5 and 6 are views respectively showing various examples of an organic light-emitting display device according to another embodiment of the present invention.

The organic light-emitting display device according to the embodiment of the present invention is described that the second hole 162h of the first bank insulating layer 161 extends in a direction perpendicular to the direction in which the auxiliary electrode extends. However, in the organic light-emitting display device according to another embodiment of the present invention, the second hole 162h of the first bank insulating layer 161 may extend in a direction parallel with the direction in which the auxiliary electrode extends, as shown in FIG. 5. A width of the second hole 162h may be larger than the width of the auxiliary electrode 150. An edge of the auxiliary electrode 150 may be exposed by the second hole 162h.

Figure 6:
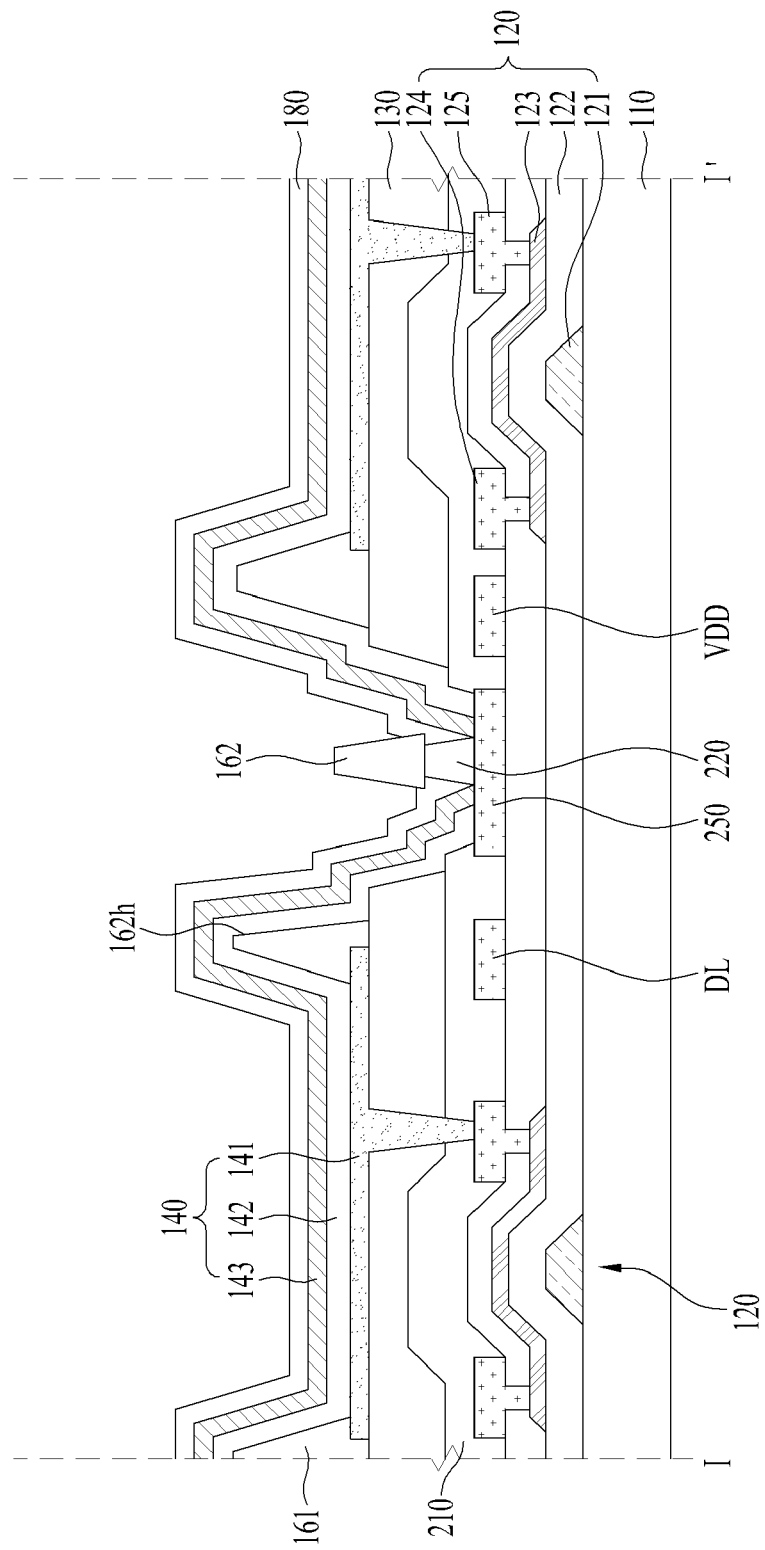

The organic light-emitting display device according to the embodiment of the present invention is described that the auxiliary electrode 150 includes a same material as the lower electrode 141, and the auxiliary electrode 150 is disposed on a same layer as the lower electrode 141. However, in the organic light-emitting display device according to another embodiment of the present invention, the auxiliary electrode 150 may include a same material as the source/drain electrodes 124 and 125, and the auxiliary electrode 150 may be disposed on a same layer as the source/drain electrodes 124 and 125, as shown in FIG. 6.

The organic light-emitting display device according to another embodiment of the present invention may further comprise a first passivation layer 210 between the thin film transistor 120 and the planarization layer 130. The second hole 162h of the first bank insulating layer 161 may partially expose the upper surface of the auxiliary electrode 250 by penetrating the planarization layer 130 and the first passivation layer 210.

In the organic light-emitting display device according to another embodiment of the present invention, a second passivation layer 220 and the second bank insulating layer 162 stacked to have an under-cut may be disposed on the auxiliary electrode 250. The under-cut by the second passivation layer 220 and the second bank insulating layer 162 may connect the upper electrode 143 of the light-emitting structure 140 to the auxiliary electrode 250.

In the organic light-emitting display device according to another embodiment of the present invention, the second passivation layer 220 and the second bank insulating layer 162 may be not in contact with the first passivation layer 210, the planarization layer 130 and the first bank insulating layer 161 within the second hole 162. The side surface of the first passivation layer 210, the side surface of the planarization layer 130 and the side surface of the first bank insulating layer 161 which face the second passivation layer 220 and the second bank insulating layer 162 may be positively tapered. The upper electrode 143 may extend onto the side surface of the first passivation layer 210, the side surface of the planarization layer 130 and the side surface of the first bank insulating layer 161. Thus, in the organic light-emitting display device according to another embodiment of the present invention, the degradation of the organic light-emitting layer 142 by the moisture permeated from the outside may be efficiently prevented.

In the result, the organic light-emitting display device according to the embodiments of the present invention may include an insulating structure which supports a partition wall and is isolated from another insulating structure disposed side by side with the insulating structure. Thus, the organic light-emitting display device according to the embodiments of the present invention may prevent that the external moisture permeates to an organic light-emitting layer through the insulating structure supporting the partition wall. Therefore, in the organic light-emitting display device according to the embodiments of the present invention, a contact area between an upper electrode and an auxiliary electrode may be sufficiently ensured by the partition wall, and the degradation of a light-emitting layer by the moisture permeated from the outside may be prevented.

It will be apparent to those skilled in the art that various modifications and variations can be made in the organic light-emitting display device having a partition wall of the present disclosure without departing from the technical idea or scope of the disclosure. Thus, it is intended that the present disclosure cover the modifications and variations of this disclosure provided they come within the scope of the appended claims and their equivalents.

What is claimed is:

1. An organic light-emitting display device, comprising:
    an auxiliary electrode disposed side by side with a lower electrode, the auxiliary electrode extending in a first direction;
    a first bank insulating layer on the lower electrode and the auxiliary electrode, the first bank insulating layer including a first hole exposing an upper surface of the lower electrode and a second hole partially exposing an upper surface of the auxiliary electrode;
    a second bank insulating layer at the inside of the second hole of the first bank insulating layer, the second bank insulating layer being entirely spaced apart from the first bank insulating layer; and
    a partition wall overlapping with the second bank insulating layer,
    wherein the second hole, the second bank insulating layer, and the partition wall extend in a second direction perpendicular to the first direction,
    wherein a width of the second bank insulating layer in the second direction is larger than a width of the auxiliary electrode in the second direction, and
    wherein a maximum horizontal area of the partition wall is larger than a horizontal area of the second bank insulating layer, and is smaller than a horizontal area of the first hole.

2. The organic light-emitting display device according to claim 1, wherein side surfaces of the first bank insulating layer facing the second bank insulating layer are positively tapered.

3. The organic light-emitting display device according to claim 1, further comprising an organic light-emitting layer and an upper electrode which are sequentially stacked on a portion of the lower electrode which is exposed by the first hole,
    wherein the upper electrode extends onto side surfaces of the first bank insulating layer facing the second bank insulating layer and directly contacts the auxiliary electrode in the second hole.

4. The organic light-emitting display device according to claim 3, wherein the side surfaces of the first bank insulating layer facing the second bank insulating layer are completely covered by the upper electrode.

5. The organic light-emitting display device according to claim 3, further comprising a protective layer on the upper electrode, the protective layer extending along the upper electrode.

6. The organic light-emitting display device according to claim 1, wherein the auxiliary electrode includes a same material as the lower electrode, and the second bank insulating layer includes a same material as the first bank insulating layer.

7. The organic light-emitting display device according to claim 1, wherein an outermost side surface of the partition wall is disposed between the first bank insulating layer and the second bank insulating layer.

8. The organic light-emitting display device according to claim 1, wherein side surfaces of the second bank insulating layer are positively tapered, and wherein side surfaces of the partition wall are negatively tapered.

9. The organic light-emitting display device according to claim 1, wherein the second bank insulating laterally shifted with respect to the first bank insulating layerso that the first and second bank insulating layersdo not overlap with respect to a vertical direction in a plan view.

10. The organic light-emitting display device according to claim 1, wherein an entirety of a lower surface of the partition wall is substantially flat, and an entirety of an upper surface of the second bank insulating layer is substantially flat,
    wherein the upper surface of the second bank insulating layer directly contacts the lower surface of the partition wall, and
    wherein a width of the lower surface of the partition wall is larger than a width of the upper surface of the second bank insulating layer.

11. An organic light-emitting display device comprising:
    an auxiliary electrode spaced apart from a lower electrode, the auxiliary electrode extending in a first direction;
    a first insulating layer on the lower electrode and the auxiliary electrode, the first insulating layer including a first hole partially exposing the lower electrode and a second hole partially exposing the auxiliary electrode; and
    an insulation structure at the inside of the second hole of the first insulating layer and entirely spaced apart from the first insulating layer, an under-cut disposed at an edge of the insulating structure,
    wherein a side surface of the first insulating layer facing the insulation structure is positively tapered,
    wherein the insulation structure includes a second insulating layer and a partition wall on the second insulating layer,
    wherein the second hole, the second insulating layer, and the partition wall extend in a second direction perpendicular to the first direction,
    wherein a width of the second insulating layer in the second direction is larger than a width of the auxiliary electrode in the second direction, and
    wherein a maximum horizontal area of the partition wall is larger than a horizontal area of the second insulating layer, and is smaller than a horizontal area of the first hole.

12. The organic light-emitting display device according to claim 11, wherein the auxiliary electrode includes a material different from the lower electrode.

13. The organic light-emitting display device according to claim 11, further comprising an organic light-emitting layer and an upper electrode which are sequentially stacked on a portion of the lower electrode which is exposed by the first hole,
    wherein the upper electrode extends onto side surfaces of the first insulating layer facing the second insulating layer and directly contacts the auxiliary electrode in the second hole.

14. The organic light-emitting display device according to claim 11, wherein an entirety of a lower surface of the partition wall is substantially flat, and an entirety of an upper surface of the second insulating layer is substantially flat,
   wherein the upper surface of the second insulating layer directly contacts the lower surface of the partition wall, and
   wherein a width of the lower surface of the partition wall is larger than a width of the upper surface of the second insulating layer.

* * * * *